United States Patent [19]
Mattfeld

[11] 3,886,465
[45] May 27, 1975

[54] CLASS B PUSH-PULL OUTPUT STAGE OF AN AMPLIFIER

[75] Inventor: Johann Mattfeld, Kirchhausen, Germany

[73] Assignee: Licentia Patent-Verwaltungs-G.m.b.H., Frankfurt am Main, Germany

[22] Filed: Oct. 16, 1973

[21] Appl. No.: 406,939

[30] Foreign Application Priority Data

Oct. 27, 1972 Germany .......... 2252666

[52] U.S. Cl. .......... 330/15; 330/13; 330/18; 330/22

[51] Int. Cl. .......... H03f 3/26

[58] Field of Search .......... 330/13, 15, 17, 18, 22, 330/40

[56] References Cited

UNITED STATES PATENTS

| | | | |
|---|---|---|---|
| 3,351,865 | 11/1967 | Dow et al. | 330/18 X |
| 3,671,770 | 6/1972 | Fredriksen | 330/40 X |
| 3,753,137 | 8/1973 | Mattfeld et al. | 330/15 |

*Primary Examiner*—R. V. Rolinec
*Assistant Examiner*—Lawrence J. Dahl
*Attorney, Agent, or Firm*—Spencer & Kaye

[57] ABSTRACT

A class B push-pull amplifier has an output stage formed of two transistors having their connector-emitter paths connected in a series path across a direct voltage source. The transistors are controlled by a driver transistor which is supplied via an additional transistor having a resistance connected in series with its emitter. A further transistor having its base-emitter path connected across this resistance is so arranged and controlled that variations in the voltage of the voltage source have little or no effect on the current through the series path linking the transistors of the output stage.

6 Claims, 1 Drawing Figure

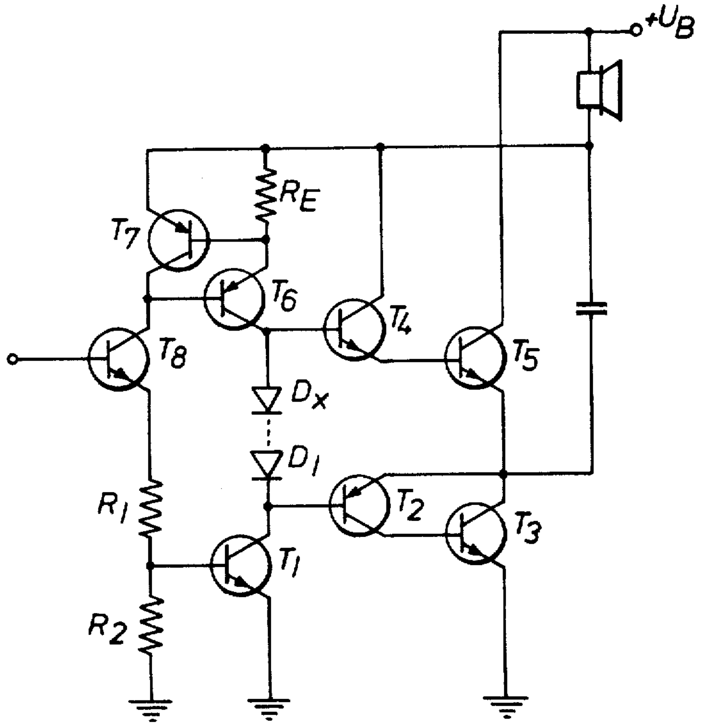
+$U_B$
$R_E$
$T_7$
$T_6$
$T_4$
$T_5$
$T_8$
$D_x$
$D_1$
$T_2$
$T_3$
$R_1$
$T_1$
$R_2$

CLASS B PUSH-PULL OUTPUT STAGE OF AN AMPLIFIER

BACKGROUND OF THE INVENTION

The invention relates to a class B push-pull output stage of an amplifier with a driver stage to trigger the output stage, in which the collector closed circuit current in the transistors of the output stage is independent of fluctuations of the supply voltage and of temperature fluctuations, there being an external resistance connected in series with the collector-emitter path of the driver transistor, which external resistance comprises the collector-emitter path of an additional transistor.

The transistors of an output stage in a class B push-pull amplifier are driven by a very small collector closed circuit current (a few mA). This collector closed circuit current must be kept constant to avoid distortions of the output signal, particularly to avoid the so-called acceptance distortions or B-distortions. For this then care must be taken that the collector closed circuit current is independent of temperature fluctuations and of changes of the supply voltage.

SUMMARY OF THE INVENTION

One object of the present invention is therefore to provide a circuit in which the collector closed circuit current in the transistors of an output stage in the case of a class B push-pull amplifier is independent of fluctuations of the battery voltage and of temperature fluctuations.

A further object of the present invention is to provide a circuit which without difficulty can be integrated in a semiconductor body, common to all components.

According to the present invention there is provided a class B push-pull amplifier, comprising an output stage which includes a first output transistor and a second output transistor having their collectors connected in a series path between first and second supply terminals, a direct voltage source across said terminals, and a driver stage comprising a driver transistor and arranged for controlling the first and second output transistors, the amplifier comprising an additional transistor connected in series with the collector-emitter path of the driver transistor and arranged for controlling the current through the driver transistor to substantially offset the effect of variations in the voltage of the direct voltage source on the current in the said series path.

Preferably, in the case of a class B push-pull output stage of the type described hereinabove, the said additional transistor is provided with an emitter resistance $R_E$ and forms part of a constant current source, and connected in parallel to the said emitter resistance is the base-emitter path of a further transistor which is connected into a current branch supplying the collector current of the further transistor. This current branch preferably comprises a transistor in the preamplification range. Thus the said further transistor can be connected, for example, into the collector path of a transistor triggering the said driver transistor.

In the case of known push-pull circuits, an ohmic resistance connected to the supply voltage is connected into the collector feed line of the driver transistor. The result of this is that with a changing supply voltage the collector current through the driver transistor changes. In the case of these known circuits at least one diode is connected in the forward direction in series with the collector resistance of the driver transistor, the voltage drop of which diode is used to trigger the output stage transistors. With this circuit, however, if the battery voltage changes greatly, a consequent change in the collector closed circuit current in the output stage transistors, caused by the changed voltage across the diode, cannot be avoided.

The circuit in accordance with the invention no longer has this disadvantage, the collector direct current of the driver transistor being maintained constant independently of the supply voltage. The present class B push-pull amplifier can also be constructed very easily using integrated solid state circuit technology. For this, in the proposed circuit, it is provided that the output stage transistors be of the same region sequence. In this case, however, for the phase reversal, a complementary transistor must be connected upstream of one of the two output stage transistors. In order to facilitate the integration of the circuit, for example in a silicon semiconductor body common to all components, the output stage transistors have npn-type conductivity, whereas the complementary transistor is for example a pnp-lateral transistor. The lateral transistor is a surface transistor, in which the emitter and collector region are arranged next to each other on the surface in a base body. The current amplification of these transistors is very small and as a rule has the value $B \sim 1$. The constant current source comprises, in the case of one circuit in accordance with the invention, the additional transistor, the further transistor, and the transistor triggering the driver transistor, of which the transistor triggering the driver transistor is a preamplifier transistor necessary for signal amplification and which is connected as an emitter follower. The additional and further transistors belonging to the constant current source are transistors complementary to the transistor triggering the driver transistor.

BRIEF DESCRIPTION OF THE DRAWING

The class B push-pull output stage and its further advantageous development will be described in greater detail by reference to an exemplary embodiment shown in the accompanying drawings as a circuit diagram.

DESCRIPTION OF THE PREFERRED EMBODIMENT

Simple class B push-pull output stages can be produced with complementary output stage transistors. Since, however, the current amplification of complementary transistors produced by integrated technology would deviate greatly from each other, a realizable replacement solution must be found. This is effected in accordance with the drawing in that the two output stage transistors $T_3$ and $T_5$ are transistors of the same region sequence, the collector-emitter paths of which are connected in series. A complementary transistor $T_2$ is connected upstream of one of these output stage transistors ($T_3$). By this measure there are provided output stage transistors with the same current amplification. Since the current amplifications of the transistors $T_3$ and $T_5$ are of the same value, the combination of the transistors $T_3$ and $T_2$ acts as a transistor complementary to $T_5$ and $T_4$ and having the current amplification corresponding to those transistors.

The emitter electrode of the transistor $T_2$ is connected to the collector electrode of the transistor $T_3$, whereas the base electrode of the transistor $T_2$ is connected for receiving the signal voltage from the collector electrode of the driver transistor $T_1$. The collector electrode of the transistor $T_5$ is connected directly to the positive pole of the supply voltage ($U_B$); the collector electrode of the transistor $T_3$ is likewise connected, by means of an isolating capacitor C and the load resistance (for example a loudspeaker), to the positive pole of the supply voltage source. The collector electrode of the transistor $T_4$, which is connected in front of the transistor $T_5$, is connected to the connection between the loudspeaker and the isolating capacitor.

The collector-emitter path of an additional transistor $T_6$ is connected in the collector feed line of the driver transistor $T_1$, the collector of this additional transistor $T_6$ being connected to the collector of the driver transistor via diodes $D_1 - D_x$ (e.g. $x = 3$) which are poled in the flow direction. The diodes $D_1 - D_x$ are so selected that the temperature behavior in each case of one diode corresponds as accurately as possible to the temperature behaviour in each case of the base-emitter path of a transistor. Temperature fluctuations are compensated for by this measure.

The transistor $T_6$ is part of the constant current source and is provided with an emitter series resistance $R_E$.

The input signal is fed by, for example, a difference amplifier to the base electrode of the preamplifier transistor $T_8$. This transistor $T_8$ which, in turn, triggers the driver transistor $T_1$ is provided in its emitter feed line with a voltage divider made up of resistances $R_1$ and $R_2$, the central tapping of which is connected to the base electrode of the driver transistor $T_1$. The collector of the preamplifier transistor $T_8$ is connected to the collector of the complementary transistor $T_7$. The common connection between these two transistors is also connected to the base electrode of the transistor $T_6$. A control circuit (not shown in FIG. 1) takes care that half the battery voltage to ground exists at the collector electrode of the transistor $T_3$. This voltage, slightly reduced only by the base-emitter voltage of the transistor $T_2$, is applied to the collector-emitter path of the transistor $T_1$ and also, for reasons of symmetry, to the collector of the driver transistor $T_6$. If then, the battery voltage drops, the collector voltages of the transistors $T_1$ and $T_6$ also inevitably drop in a corresponding manner. The collector current through the transistors $T_1$ and $T_6$ however remains constant.

This rests on the fact that in the case of a dropping collector current through the transistor $T_6$ the voltage drop at the resistance $R_E$ also decreases. In this way, the triggering of the transistor $T_7$ is reduced and the voltage at the base electrode of the transistor $T_6$ is reduced. The resulting stronger triggering of the transistor $T_6$ again provides for an increase in the collector current. The tendency for the current through the transistor $T_6$ to decrease is thus counteracted by means of the current stabilization circuit, so that a steady current always flows through the collectors of the transistors $T_6$ and $T_1$ and through the diodes $D_1$–$D_x$. The collector direct current in the output stage transistors $T_3$ and $T_5$ is thus independent of the battery voltage.

The described circuit has, in addition to the said advantages, the further advantage that the collector closed circuit current is independent of the current amplification factors of the transistors $T_6$ and $T_7$. The circuit can moreover be accommodated very easily in a semiconductor body integrating the components. The transistors $T_1$, $T_3$, $T_4$, $T_5$ and $T_8$ are, for example, npn-planar transistors, the complementary transistors $T_2$, $T_6$ and $T_7$ then having a pnp-region sequence.

It will be understood that the above description of the present invention is susceptible to various modifications changes and adaptations.

What is claimed is:

1. In an amplifier having a class B push-pull transistor output stage, a driver stage including a driver transistor for triggering said output stage and means for maintaining the collector closed circuit current of the transistors of said output stage independent of temperature fluctuations, and means, including an external load resistance connected in series with the emitter-collector path of said driver transistor across the supply voltage terminals for the amplifier, for maintaining the collector closed circuit current of the transistors of said output stage independent of supply voltage fluctuations, the improvement wherein: said amplifier further includes a signal input transistor having its output connected to the base of said driver transistor and arranged for triggering said driver transistor; said external load resistance comprises the collector-emitter path of an additional transistor provided with an emitter resistor and forming part of a contstant current source; and said constant current source further includes a further transistor having its base emitter path connected in parallel with said emitter resistor, and its emitter collector path connected into the collector path of said transistor arranged for triggering the said driver transistor, the collector of said further transistor being connected to the base of said additional transistor.

2. An amplifier having a class B push-pull output stage according to claim 1, wherein the said additional and further transistors belonging to the constant current source are complementary transistors to the said transistor arranged for triggering the said driver transistor.

3. An amplifier having a class B push-pull output stage according to claim 1, wherein the said transistor arranged for triggering the said driver transistor is provided in its emitter feed line with a voltage divider the mean tapping of which is connected to the base electrode of the said driver transistor.

4. An amplifier having a class B push-pull output stage according to claim 1, wherein the said transistor arranged for triggering the said driver transistor is a pre-amplifying transistor connected as an emitter follower.

5. An amplifier having a class B push-pull output stage according to claim 1, wherein the components of the circuit are accommodated in a common semiconductor body in an integrated form.

6. A class B push-pull amplifier, comprising an output stage which includes a first output transistor and a second output transistor having their collectors connected in a series path between first and second supply terminals, a direct voltage source across said terminals, a driver stage comprising a driver transistor and arranged for controlling the first and second output transistors, and means, including an additional transistor having its emitter collector path and an emitter resistor therefore connected in series with the collector-emitter path of the driver transistor between said supply terminals, for controlling the current through the driver transistor to substantially offset the effect of variations in the voltage of the direct voltage source on the current in the said series path, said means further including a further transistor having its emitter-base path connected in parallel with said emitter resistor and its collector connected to the base of said additional transistor, a signal input transistor having its emitter-collector path connected in series with the emitter-collector path of said further transistor, and a voltage divider connected between the emitter of said signal input transistor and one of said supply terminals, the tap of said voltage divider being connected to the base of said driver transistor.

* * * * *